United States Patent
Hartner et al.

(10) Patent No.: US 11,798,874 B2
(45) Date of Patent: Oct. 24, 2023

(54) SEMICONDUCTOR DEVICES COMPRISING ELECTRICAL REDISTRIBUTION LAYER ALONG WITH GROUND LINE AND SIGNAL LINE AND METHODS FOR MANUFACTURING THEREOF

(71) Applicant: Infineon Technologies AG, Neubiberg (DE)

(72) Inventors: Walter Hartner, Bad Abbach-Peissing (DE); Francesca Arcioni, Munich (DE); Tuncay Erdoel, Unterhaching (DE); Vincenzo Fiore, Linz (AT); Helmut Kollmann, Linz (AT); Arif Roni, Neubiberg (DE); Emanuele Stavagna, Linz (AT); Christoph Wagner, Enns (AT)

(73) Assignee: Infineon Technologies AG, Neubiberg (DE)

( * ) Notice: Subject to any disclaimer, the term of this patent is extended or adjusted under 35 U.S.C. 154(b) by 67 days.

(21) Appl. No.: 17/456,806

(22) Filed: Nov. 29, 2021

(65) Prior Publication Data

US 2022/0181246 A1 Jun. 9, 2022

(30) Foreign Application Priority Data

Dec. 8, 2020 (DE) .......................... 102020132641.6

(51) Int. Cl.
*H01L 23/52* (2006.01)
*H01L 23/552* (2006.01)
(Continued)

(52) U.S. Cl.
CPC .... *H01L 23/49838* (2013.01); *H01L 23/5283* (2013.01); *H01L 23/5286* (2013.01);
(Continued)

(58) Field of Classification Search
CPC ........... H01L 23/49838; H01L 23/5283; H01L 23/5286; H01L 23/66; H01L 24/08;
(Continued)

(56) References Cited

U.S. PATENT DOCUMENTS

| 2016/0190673 A1 | 6/2016 | Huang et al. |
| 2017/0077049 A1* | 3/2017 | Yuasa ..................... H01L 24/06 |

(Continued)

FOREIGN PATENT DOCUMENTS

EP 2860756 A1 4/2015

*Primary Examiner* — Didarul A Mazumder
(74) *Attorney, Agent, or Firm* — Harrity & Harrity, LLP

(57) ABSTRACT

A semiconductor device includes a semiconductor chip including an electrical contact arranged on a main surface of the semiconductor chip, an external connection element configured to provide a first electrical connection between the semiconductor device and a printed circuit board, and an electrical redistribution layer extending in a direction parallel to the main surface of the semiconductor chip and configured to provide a second electrical connection between the electrical contact of the semiconductor chip and the external connection element. The electrical redistribution layer includes a ground line connected to a ground potential and a signal line configured to carry an electrical signal having a wavelength.

21 Claims, 13 Drawing Sheets

(51) Int. Cl.
*H01L 23/498* (2006.01)
*H01L 23/66* (2006.01)
*H01L 23/00* (2006.01)
*H01L 23/528* (2006.01)

(52) U.S. Cl.
CPC ............ H01L 23/552 (2013.01); H01L 23/66 (2013.01); H01L 24/08 (2013.01); H01L 24/16 (2013.01); *H01L 2223/6627* (2013.01); *H01L 2224/02375* (2013.01); *H01L 2224/02379* (2013.01); *H01L 2224/02381* (2013.01); *H01L 2224/16238* (2013.01); *H01L 2924/3025* (2013.01)

(58) Field of Classification Search
CPC ............. H01L 24/16; H01L 2223/6627; H01L 2924/3025; H01L 23/552
USPC ......... 257/410; 438/216, 261, 421, 591, 595
See application file for complete search history.

(56) References Cited

U.S. PATENT DOCUMENTS

2020/0118951 A1* 4/2020 Aleksov .............. H01L 21/4857
2020/0176407 A1* 6/2020 Lee .................... H01L 23/5226
2020/0321295 A1* 10/2020 Hartner ............... H01L 23/5227
2020/0388583 A1* 12/2020 Theuss ................ H01L 23/5283

* cited by examiner

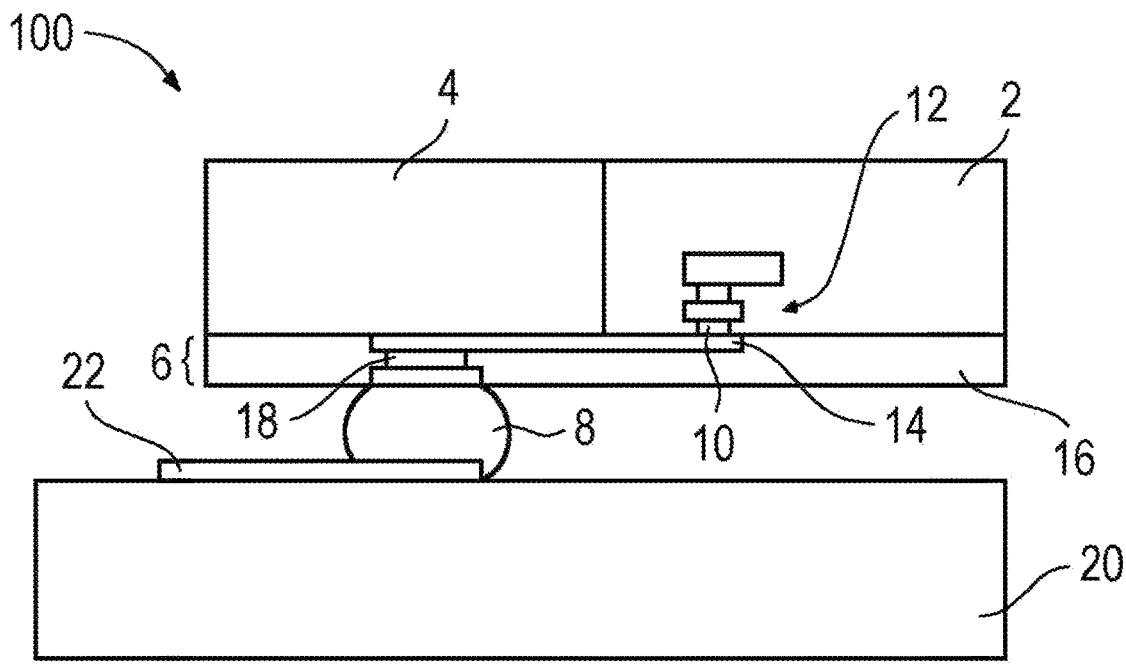
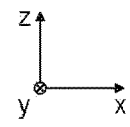
Fig. 1
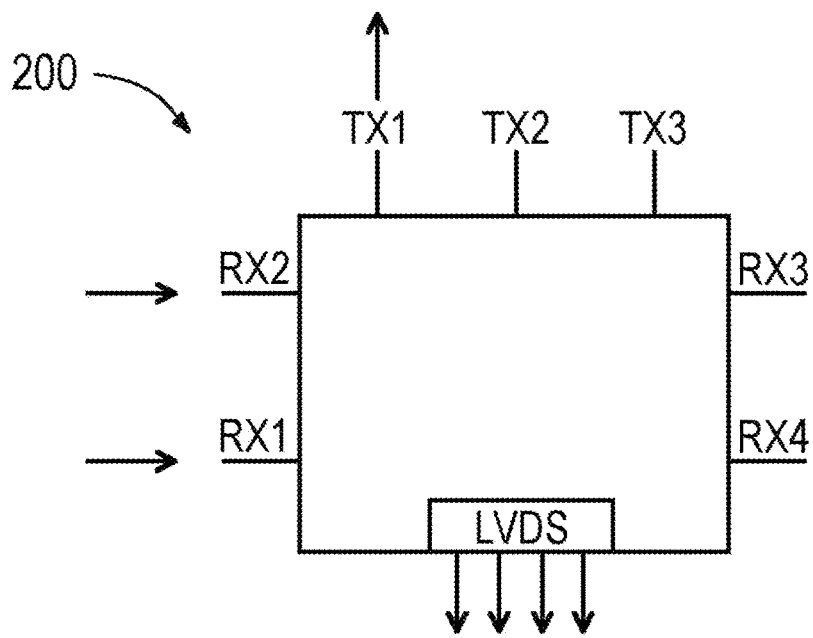
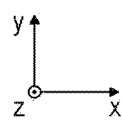
Fig. 2

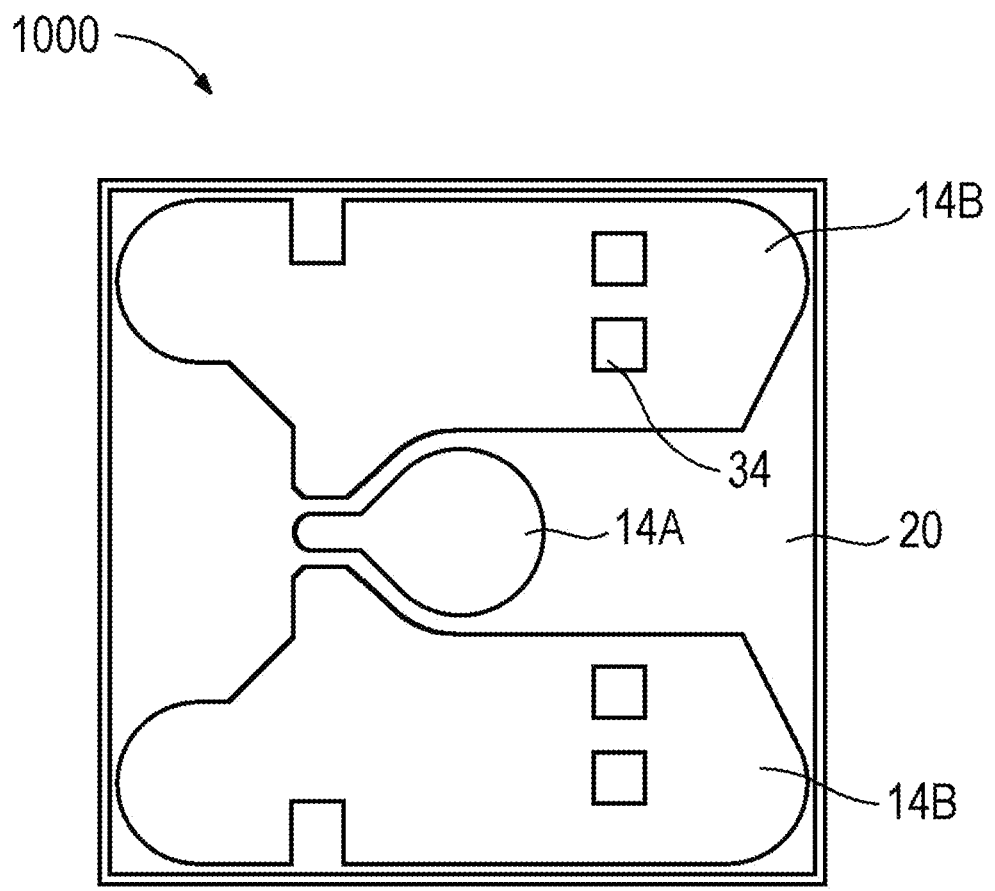
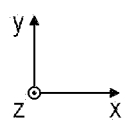
Fig.10

SEMICONDUCTOR DEVICES COMPRISING ELECTRICAL REDISTRIBUTION LAYER ALONG WITH GROUND LINE AND SIGNAL LINE AND METHODS FOR MANUFACTURING THEREOF

CROSS REFERENCE TO RELATED APPLICATION

This application claims priority to German Patent Application No. 102020132641.6, filed on Dec. 8, 2020, the contents of which are incorporated by reference herein in their entirety.

TECHNICAL FIELD

The present disclosure relates to semiconductor devices and methods for manufacturing such semiconductor devices. More particular, the present disclosure relates to electrical redistribution layers of semiconductor devices including ground lines and signal lines.

BACKGROUND

Radio-based communication devices, such as e.g. MIMO (Multiple-Input Multiple-Output) systems, may include multiple communications channels for transmitting and/or receiving radio signals. During an operation of such semiconductor devices undesired crosstalk resulting from electromagnetic interferences may occur between adjacent communication channels as well as between the communication channels and the semiconductor substrate. Manufacturers of semiconductor devices are constantly striving to improve their products. In particular, it may be desirable to reduce electromagnetic interferences and thus the above-mentioned crosstalk types, thereby increasing performance and reliability of the semiconductor devices. In addition, it may be desirable to provide methods for manufacturing such improved semiconductor devices.

SUMMARY

An aspect of the present disclosure relates to a semiconductor device. The semiconductor device comprises a semiconductor chip comprising an electrical contact arranged on a main surface of the semiconductor chip. The semiconductor device further comprises an external connection element configured to provide a first electrical connection between the semiconductor device and a printed circuit board. The semiconductor device further comprises an electrical redistribution layer extending in a direction parallel to the main surface of the semiconductor chip and configured to provide a second electrical connection between the electrical contact of the semiconductor chip and the external connection element. The electrical redistribution layer comprises a ground line connected to a ground potential and a signal line configured to carry an electrical signal having a wavelength. When viewed in a direction perpendicular to the main surface of the semiconductor chip: a width of a gap between the ground line and the signal line is continuously smaller than 10 percent of the wavelength and at least smaller than 40 micrometers along a path, a starting point of the path and the electrical contact of the semiconductor chip have a similar position with respect to a direction from the electrical contact to a center of the external connection element, and an end point of the path and the center of the external connection element have a similar position with respect to the direction from the electrical contact to the center of the external connection element.

An aspect of the present disclosure relates to a semiconductor device. The semiconductor device comprises a semiconductor chip comprising an electrical contact arranged on a main surface of the semiconductor chip. The semiconductor device further comprises an external connection element configured to provide a first electrical connection between the semiconductor device and a printed circuit board. The semiconductor device further comprises an electrical redistribution layer extending in a direction parallel to the main surface of the semiconductor chip and configured to provide a second electrical connection between the electrical contact of the semiconductor chip and the external connection element. The electrical redistribution layer comprises a ground line connected to a ground potential and a signal line configured to carry an electrical signal. When viewed in a direction perpendicular to the main surface of the semiconductor chip: a variation of a width of a gap between the ground line and the signal line is continuously smaller than 25 percent of the width of the gap along a path, a starting point of the path and the electrical contact of the semiconductor chip have a similar position with respect to a direction from the electrical contact to a center of the external connection element, and an end point of the path and the center of the external connection element have a similar position with respect to the direction from the electrical contact to the center of the external connection element.

An aspect of the present disclosure relates to a semiconductor device. The semiconductor device comprises a semiconductor chip comprising an electrical contact arranged on a main surface of the semiconductor chip. The semiconductor device further comprises an external connection element configured to provide a first electrical connection between the semiconductor device and a printed circuit board. The semiconductor device further comprises an electrical redistribution layer extending in a direction parallel to the main surface of the semiconductor chip and configured to provide a second electrical connection between the electrical contact of the semiconductor chip and the external connection element. The electrical redistribution layer comprises a ground line connected to a ground potential and a first signal line associated with a first RF channel and configured to carry an electrical signal. An electromagnetic isolation between the first signal line and a second signal line arranged adjacent to the first signal line and associated with a second RF channel is more than 30 dB.

An aspect of the present disclosure relates to a method for manufacturing a semiconductor device. The method comprises generating a semiconductor chip comprising an electrical contact arranged on a main surface of the semiconductor chip. The method further comprises fabricating an external connection element configured to provide a first electrical connection between the semiconductor device and a printed circuit board. The method further comprises fabricating an electrical redistribution layer extending in a direction parallel to the main surface of the semiconductor chip and configured to provide a second electrical connection between the electrical contact of the semiconductor chip and the external connection element. The electrical redistribution layer comprises a ground line connected to a ground potential and a signal line configured to carry an electrical signal having a wavelength. When viewed in a direction perpendicular to the main surface of the semiconductor chip: a width of a gap between the ground line and the signal line is continuously smaller than 10 percent of the wavelength and at least smaller than 40 micrometers along a path, a starting point of the path and the electrical contact of the semiconductor chip have a similar position with respect to a direction from the electrical contact to a center of the external connection element, and an end point of the path and the center of the external connection element have a similar position with respect to the direction from the electrical contact to the center of the external connection element.

BRIEF DESCRIPTION OF THE DRAWINGS

The accompanying drawings are included to provide a further understanding of aspects and are incorporated in and constitute a part of this description. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

FIG. 1 schematically illustrates a cross-sectional side view of a semiconductor device 100 in accordance with the disclosure.

FIG. 2 schematically illustrates a top view of a semiconductor device 200 in accordance with the disclosure.

FIG. 10 schematically illustrates a top view of a portion of a semiconductor device 1000 in accordance with the disclosure.

DETAILED DESCRIPTION

Figure 3:
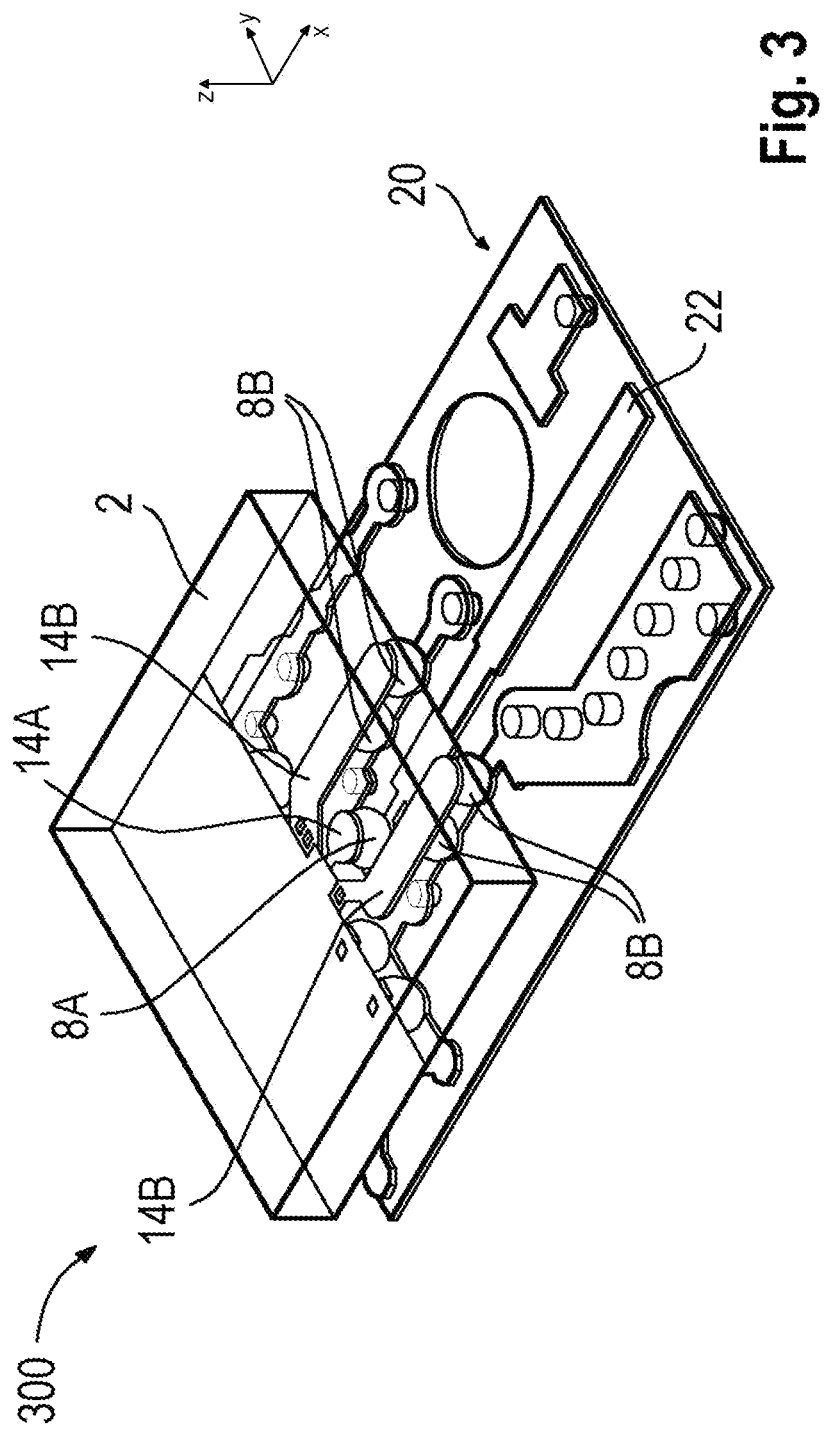
FIG. 3 schematically illustrates a perspective view of a portion of a semiconductor device 300 in accordance with the disclosure.

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

The semiconductor device 100 of FIG. 1 may include a semiconductor chip 2 (which may also be referred to as a semiconductor die) embedded in an encapsulation material 4. An electrical redistribution layer 6 may be arranged over the semiconductor chip 2 and over the encapsulation material 4. One or more external connection elements 8 may provide a mechanical connection and an electrical connection (e.g. a galvanic connection) between the semiconductor device 100 and a printed circuit board 20.

The semiconductor chip 2 (or electronic circuits of the semiconductor chip 2) may operate in a frequency range of higher than about 1 GHz, in some implementations higher than about 10 GHz. The semiconductor chip 2 may thus also be referred to as an RF ("radio frequency") chip or an HF ("high frequency") chip. In some implementations, the semiconductor chip 2 may operate in a high frequency range or microwave frequency range, which may range from about 10 GHz to about 300 GHz. Microwave circuits may include, for example, microwave transmitters, microwave receivers, microwave transceivers, microwave sensors, microwave detectors, etc. Semiconductor devices in accordance with the disclosure may be used for radar applications in which the frequency of the RF signals may be modulated. Accordingly, the semiconductor chip 2 may particularly correspond to a radar chip. Radar microwave devices may be used, for example, in automotive or industrial applications for range and speed measuring systems. By way of example, automatic vehicle cruise control systems or vehicle anti-collision systems may operate in the microwave frequency range, for example in the frequency bands from about 76 GHz to about 77 GHz and from about 77 GHz to about 81 GHz.

The semiconductor devices in accordance with the disclosure as described herein need not be limited to the exemplary technical areas mentioned above. In further examples, the concepts presented herein may also be implemented for the following RF applications (list not exhaustive): technologies at frequencies beyond 100 GHz, e.g. THz technologies; high data transfer communication systems (e.g. 5G, etc.) and wireless backhaul systems; body scanning systems for security; medical and health monitoring systems (e.g. medical sensors and data transfer); radar systems; GBit automotive Ethernet; camera interfaces; gaming sensors; Industry 4.0; food control; radio-astronomy and earth observation; etc.

The semiconductor chip 2 may include one or more electrical contacts 10 that may be arranged at a main surface of the semiconductor chip 2. For example, an electrical contact 10 may be formed by a metal pad which may, for example, be made of aluminum. In addition, an internal electrical wiring 12 arranged inside of the semiconductor chip 2 may be electrically connected to the electrical contact 10. Electrical circuits (not illustrated) of the semiconductor chip 2 may be electrically accessible via the electrical contact 10 and the internal electrical wiring 12.

The semiconductor chip 2 may be at least partly embedded in the encapsulation material 4. In the example of FIG. 1, the encapsulation material 4 may cover one or more side surfaces of the semiconductor chip 2. In some implementations, the encapsulation material 4 may also cover the upper main surface of the semiconductor chip 2. The lower main surface of the semiconductor chip 2 may be uncovered by the encapsulation material 4. Rather, the lower main surface of the encapsulation material 4 and the lower main surface of the semiconductor chip 2 may be arranged in a common plane. The encapsulation material 4 may form a housing (or package) of the semiconductor chip 2, and the semiconductor device 100 including the encapsulation material 4 and the semiconductor chip 2 may also be referred to as a semiconductor package. The encapsulation material 4 may include at least one of the following materials: epoxy, filled epoxy, glass fiber filled epoxy, imide, thermoplast, thermoset polymer, polymer blend, etc. In some implementations, the encapsulation material 4 may be formed from a mold compound.

The electrical redistribution layer 6 may include one or more electrically conductive structures 14 in the form of metal layers (or metal tracks), which may extend substantially parallel to the main surfaces of the semiconductor chip 2 and the encapsulation material 4. In the exemplary sectional side view of FIG. 1, the redistribution layer 6 is shown to substantially include one metal track 14. However, as will become apparent later on, the electrically conductive structures 14 may include one or more ground lines connected to a ground potential as well as one or more signal lines configured to carry electrical signals. The metal layers 14 may be made of copper or a copper alloy in one example. One or more dielectric layers 16 may be arranged between the metal layers 14 to electrically isolate the metal layers 14 from each other. For example, the dielectric layers 16 may be made of at least one of an imide, oxide or a nitride. Furthermore, metal layers 14 arranged on different vertical levels may be electrically connected to each other by one or more via connections 18. The internal electrical wiring 12 and/or the electrical redistribution layer 6 may be referred to as a first level interconnect of the semiconductor device 100.

The electrical redistribution layer 6 may at least partly extend along the lower main surface of the encapsulation material 4. Accordingly, at least one of the external connection elements 8 may be arranged lateral to the semiconductor chip 2. In such case, the semiconductor device 100 may be referred to as a fan-out semiconductor device or a fan-out semiconductor package. In the example of FIG. 1, the semiconductor device 100 may correspond to a wafer level semiconductor package which may be manufactured based on an eWLB (embedded Wafer Level Ball Grid Array) process. That is, the semiconductor device 100 may correspond to an eWLB package.

The semiconductor device 100 may be mounted on the printed circuit board 20 using the external connection element 8. Electronic structures of the semiconductor chip 2 may be electrically accessible from outside of the semiconductor package via the external connection element 8. For example, an external electrical connection element 8 may provide electrical access to a transmit (TX) channel or a receive (RX) channel of the semiconductor chip 2. In the example of FIG. 1, the external connection element 8 is shown to include a conductor structure such as a solder ball or a solder pillar. In some implementations, a connection via a solder ball can span more than one ball diameter distance from the silicon edge of the semiconductor device 100. The external connection element 8 may form a second level interconnect of the semiconductor device 100 connecting the semiconductor package with the printed circuit board 20.

The printed circuit board 20 may include one or more electrically conductive structures 22 arranged on the top surface and/or on the bottom surface of the printed circuit board 20 as well as electrically conductive structures arranged inside of the printed circuit board 20. The semiconductor device 100 may include the printed circuit board 20 or not.

The semiconductor device 200 of FIG. 2 may include some or all of the features of the semiconductor device 100 of FIG. 1. In the example of FIG. 2, the semiconductor device 200 may include three transmit (TX) channels TX1 to TX3 that may be arranged at the upper edge of the semiconductor device 200. In addition, the semiconductor device 200 may include two receive (RX) channels RX1, RX2 that may be arranged at the left edge of the semiconductor device 200 and two receive (RX) channels RX3, RX4 arranged at the right edge of the semiconductor device 200. It is understood that other semiconductor devices in accordance with the disclosure may include an arbitrary different numbers of TX channels and/or RX channels, with an arbitrary different arrangement with respect to the edges of the semiconductor device 200.

The semiconductor device 300 of FIG. 3 may include some or all of the features of the semiconductor devices 100 and 200 of FIGS. 1 and 2. For the sake of simplicity and illustrative purposes, not all components of the semiconductor device 300 are shown, such as, for example, an encapsulation material or dielectric layers of an electrical redistribution layer.

The electrical redistribution layer of the semiconductor device 300 may include one or more signal lines 14A configured to carry electrical signals as well as one or more ground lines 14B connected to a ground potential. For example, signal lines as described herein may be single-ended signal lines. FIG. 3 exemplarily shows one signal line 14A arranged between two ground lines 14B forming a ground-signal-ground (GSG) arrangement in which the ground lines 14B may be configured to provide a shielding of electromagnetic fields generated by signals transmitted via the signal line 14A. In some implementations, the GSG arrangement may form an electrical connection similar to a coplanar waveguide. The electromagnetic shielding provided by the ground lines 14B may inter alia provide low RF losses, low dispersion, and/or reduced electromagnetic interference.

The signal line 14A may be electrically connected to an electrical contact of the semiconductor chip 2 such that the GSG arrangement may, for example, be associated with an RF channel of the semiconductor chip 2. In this regard, it is to be noted that FIG. 3 only shows one such GSG arrangement for the sake of simplicity. However, semiconductor devices in accordance with the disclosure may include an arbitrary number of GSG arrangements and RF channels. In some implementations, each RF channel of the semiconductor chip 2 may be associated with one GSG arrangement, as shown for example in the implementation of FIG. 12.

Each of the ground lines 14B may be mechanically and electrically coupled to ground structures at the upper surface of the printed circuit board 20 via external connection elements 8B. In a similar fashion, the signal line 14A may be mechanically and electrically coupled to an electrically conductive structure 22 on the upper surface of the printed circuit board 20 via an external connection element 8A. An opposite end of the electrically conductive structure 22 may be electrically coupled to one or multiple further elements of the semiconductor device 300, such as, for example, a TX antenna and/or an RX antenna (not illustrated). That is, an RF channel of the semiconductor chip 2 may be connected to an associated RF antenna via the electrical contact 10, the signal line 14*a*, the external connection element 8A, and the electrically conductive structure 22.

Figure 4:
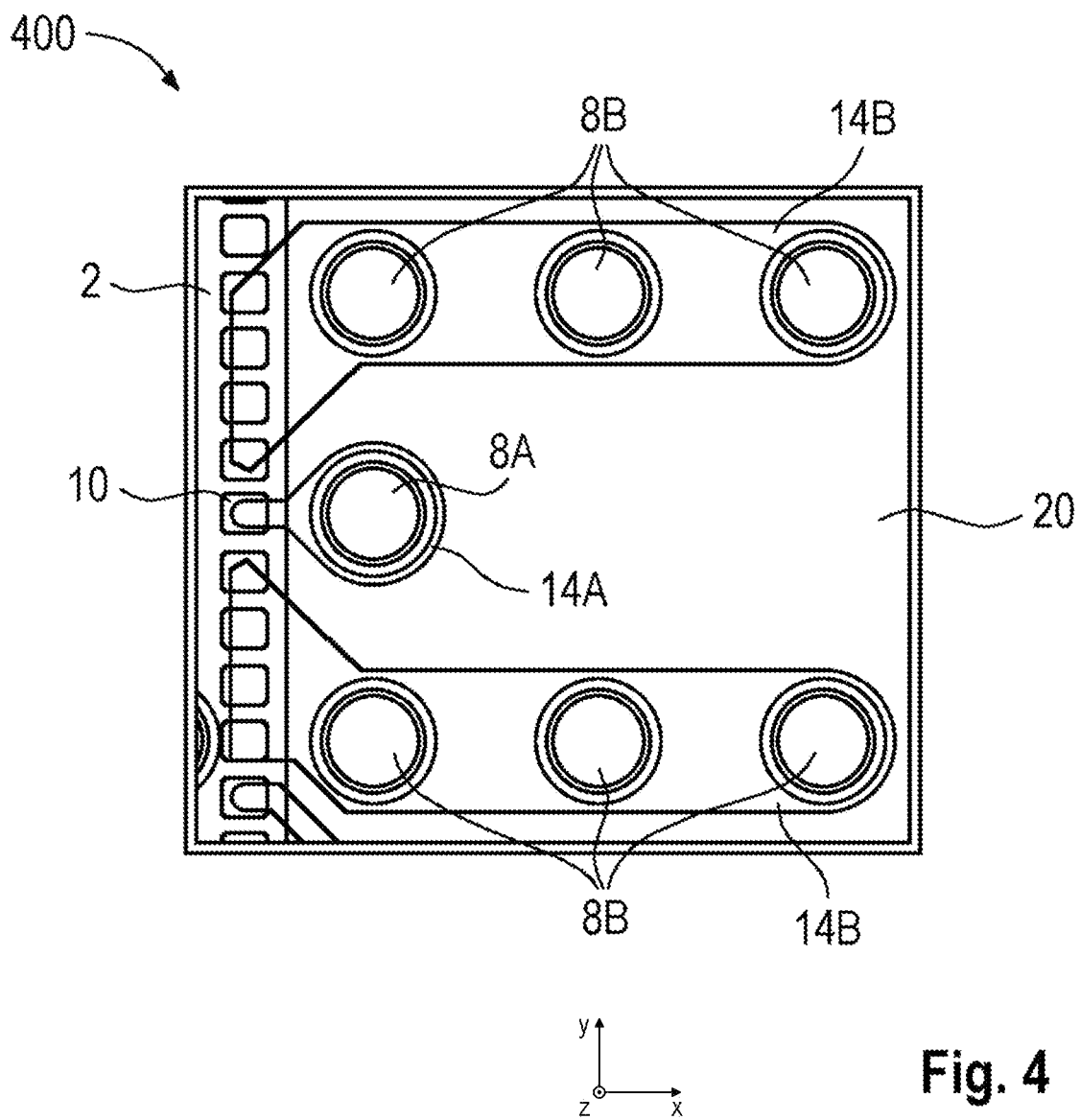
FIG. 4 schematically illustrates a top view of a portion of a semiconductor device 400.

The semiconductor device 400 of FIG. 4 may include some or all of the features of the semiconductor devices described in connection with foregoing examples. FIG. 4 shows an electrical redistribution layer including a GSG arrangement with a signal line 14A sandwiched between two ground lines 14B. The GSG arrangement of FIG. 4 may be at least partly similar to the GSG arrangement shown and described in connection with FIG. 3. In the example of FIG. 4, the ground lines 14B are connected to the printed circuit board 20 via three external connection elements 8B, respectively. In some implementations, the number of external connection elements 8B may be smaller (see e.g., FIG. 8) or larger.

Figure 5:
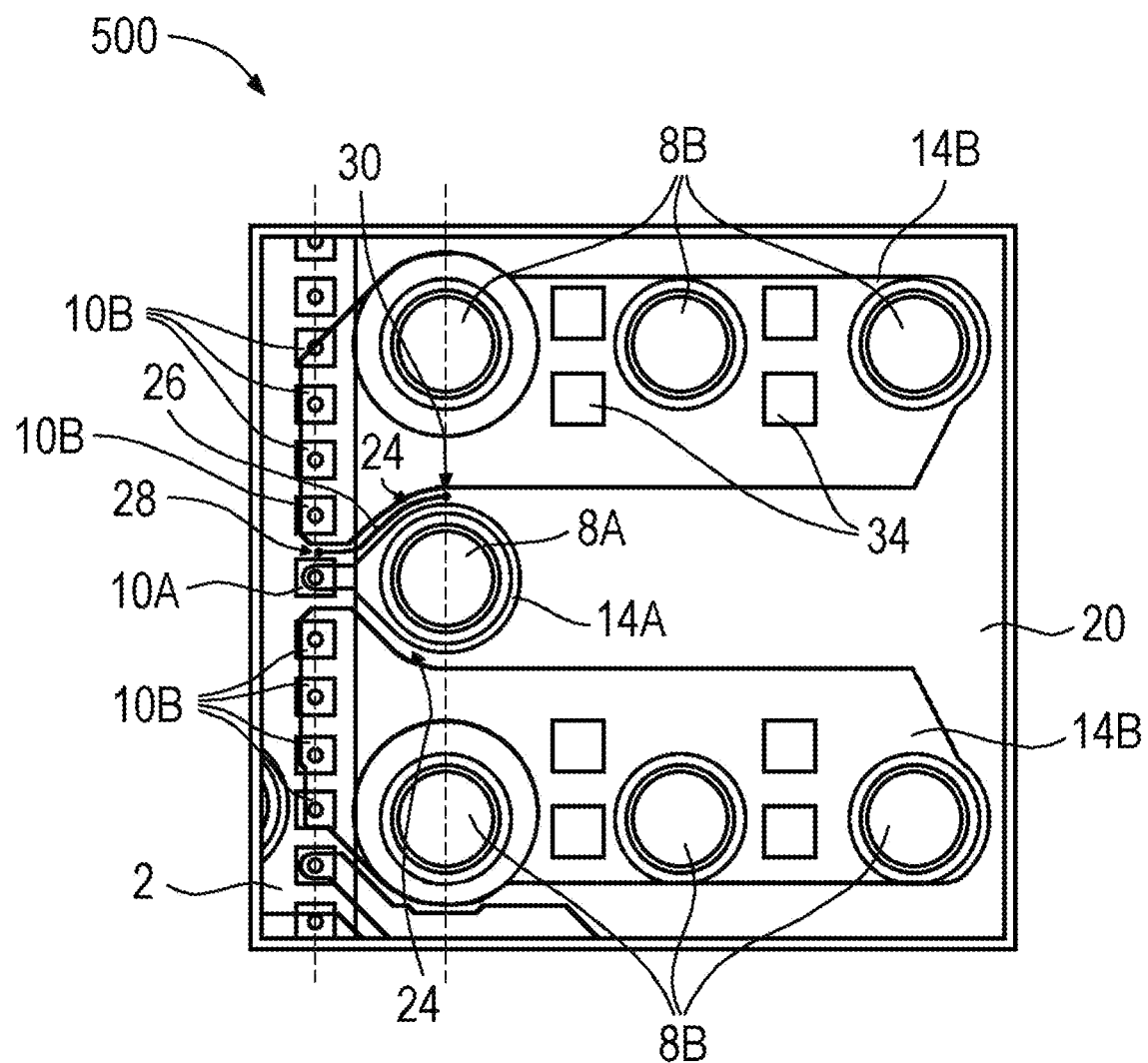
FIG. 5 schematically illustrates a top view of a portion of a semiconductor device 500 in accordance with the disclosure.

The semiconductor device 500 of FIG. 5 may include some or all of the features of the semiconductor devices described in connection with foregoing examples. The semiconductor device 500 includes a GSG arrangement with a signal line 14A sandwiched between two ground lines 14B. The ground line 14B shown in the upper part of FIG. 5 may be electrically connected to one or more ground contacts 10B which may be arranged at the right edge of the semiconductor chip 2. Starting from the ground contacts 10B, a first portion of the upper ground line 14B may extend in a first diagonal direction having a first angle with respect to the x-direction. In the example of FIG. 5, the first angle may have a value of about 45 degrees. More general, the first angle may lie in a range from about 20 degrees to about 70 degrees, more particular from about 30 degrees to about 60 degrees, and even more particular from about 40 degrees to about 50 degrees. The first portion of the upper ground line 14B may merge into a second portion of the upper ground line 14B extending in a direction substantially parallel to the x-direction. That is, the upper ground line 14B may be bent by a second angle arranged between the first portion and the second portion of the upper ground line 14B. In the example of FIG. 5, the second angle may have a value of about 135 degrees. A width of the ground line 14B in the y-direction may be in a range from about 250 micrometers to about 600 micrometers, or from about 300 micrometers to about 550 micrometers, or from about 350 micrometers to about 500 micrometers, or from about 400 micrometers to about 450 micrometers.

The lower ground line 14B may be electrically connected to one or more ground contacts 10B which may be arranged parallel or close to the right edge of the semiconductor chip 2. The shape of the lower ground line 14B may be symmetric to the shape of the upper ground line 14B with respect to an axis substantially extending in the x-direction. The signal line 14A may be electrically connected to an electrical contact 10A of the semiconductor chip 2 which may be arranged at the right edge of the semiconductor chip 2. In some implementations, the electrical contact 10A may be associated with an RF port of the semiconductor chip 2. In the example of FIG. 5, the signal line 14A may include a small first portion having a small width and connected to the electrical contact 10A which may merge into a bigger second portion of the signal line 14A having a substantially circular shape.

Gaps 24 may be arranged between the signal line 14A and the ground lines 14B, respectively. In the following, reference is made to the upper gap 24 arranged between the signal line 14A and the upper ground line 14B. However, features described in the following with respect to the upper gap 24 may similar be present for the lower gap 24 arranged between the signal line 14A and the lower ground line 14B. A portion of the gap 24 may extend along a path 26. In the top view of FIG. 5, a starting point 28 of the path 26 and the electrical contact 10A of the semiconductor chip 2 may have a similar position with respect to a direction extending from the electrical contact 10A to a center of the external connection element 8A. In the example of FIG. 5, this direction may be substantially similar to the x-direction. In other words, the starting point 28 of the path 26 and the electrical contact 10A of the semiconductor chip 2 may have a substantially similar x-coordinate. To be more specific, the starting point 28 of the path 26 and the center of the electrical contact 10A may have a similar x-coordinate. In a similar fashion, an end point 30 of the path 26 and the center of the external connection element 8A may have a substantially similar x-coordinate. The path 26 may at least partly extend in parallel to the direction extending from the electrical contact 10A to the center of the external connection element 8A, e.g., in parallel to the x-direction. A length of this parallel path section may be at least 10 percent of the length between the electrical contact 10A and the center of the external connection element 8A, or at least 15 percent, or at least 20 percent, or at least 25 percent, or at least 30 percent.

According to an implementation, a width of the gap 24 along the path 26 is continuously smaller than about 10 percent of a wavelength of an electrical signal transmitted via the signal line 14A and at least smaller than 40 micrometers, or at least smaller than 38 micrometers, or at least smaller than 36 micrometers, or at least smaller than 34 micrometers, or at least smaller than 32 micrometers, or at least smaller than 30 micrometers. In other implementations, the width may be smaller than about 7.5 percent of the wavelength, smaller than about 5 percent of the wavelength, or smaller than about 2.5 percent of the wavelength. Ranges of exemplary signal wavelengths may be based on or may correspond to the frequency ranges as previously discussed in connection with FIG. 1.

The width of the gap 24 along the path 26 may vary only slightly and may thus remain substantially constant. In this regard, a variation of the width of the gap 24 along the path 26 is according to one example continuously smaller than about 25 percent of the width of the gap 24. In other examples the width of the gap may be smaller than about 20 percent, smaller than about 15 percent, smaller than about 10 percent, or smaller than about 5 percent. A dimension of the width of the gap 24 along the path 26 may be according to some examples continuously smaller than about 40 micrometers, smaller than about 35 micrometers, smaller than about 30 micrometers, smaller than about 25 micrometers, or smaller than about 20 micrometers.

In the example of FIG. 5, the electrical redistribution layer (in particular one or more of the ground lines 14B) may optionally include one or more holes 34 arranged in the material of the electrical redistribution layer. The holes 34 may be formed during a manufacturing process of the electrical redistribution layer. The holes 34 may be referred to as a cheesing pattern in the electrical redistribution layer.

Figure 6:
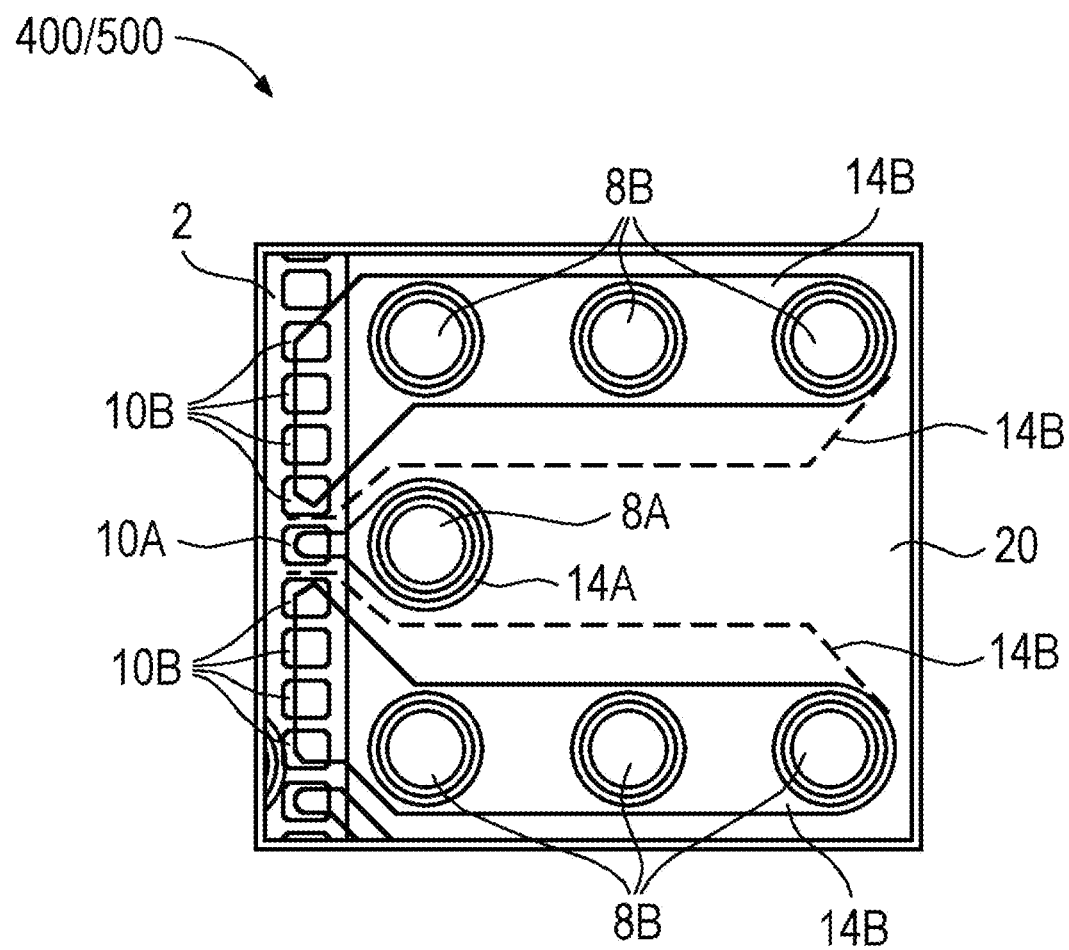
FIG. 6 schematically illustrates a comparison between the semiconductor devices 400 and 500 of FIGS. 4 and 5.

FIG. 6 illustrates a comparison between the electrical redistribution layers of the semiconductor devices 400 and 500 of FIGS. 4 and 5. The ground lines 14B of the semiconductor device 400 of FIG. 4 are illustrated as solid lines and may be regarded as conventional. In contrast to this, the areas of the ground lines 14B of the semiconductor device 500 of FIG. 5 deviating from the conventional ground lines 14B are illustrated as dashed lines and may be regarded as in accordance with the disclosure. The width of the ground lines 14B of the semiconductor device 500 of FIG. 5 may be increased compared to the width of the ground lines 14B of the semiconductor device 400 of FIG. 4. Additionally or alternatively, a width of the gap(s) 24 (e.g. the ground-signal distance or the ground-signal-ground distances) may be reduced for the semiconductor device 500 of FIG. 5 compared to the semiconductor device 400 of FIG. 4.

Employing wider ground lines 14B and/or narrower widths of the gap(s) 24 in accordance with the disclosure may result in various technical effects described in the following.

For example, a high effectiveness of shielding, low RF losses, low dispersion, and reduced electromagnetic interference can be achieved in accordance with the disclosure herein. More specifically, an electrical coupling between adjacent communication channels as well as between communication channels and the semiconductor substrate may be reduced. Transversal as well as longitudinal electrical couplings from signal balls to the chip substrate may be reduced or minimized.

Electromagnetic interference between communication channels may be reduced such that electromagnetic susceptibility (EMS) of individual channels may be increased, for example in MIMO transceivers. Low electromagnetic interference may reduce inter-channel crosstalk and/or may increases RF isolation. Low electromagnetic interference may improve several figures of merits (FOM) at the system level.

Confinement of electromagnetic fields may be increased which may imply that ground planes in lateral directions can be cheesed without any degradation of the RF performance.

Figure 7:
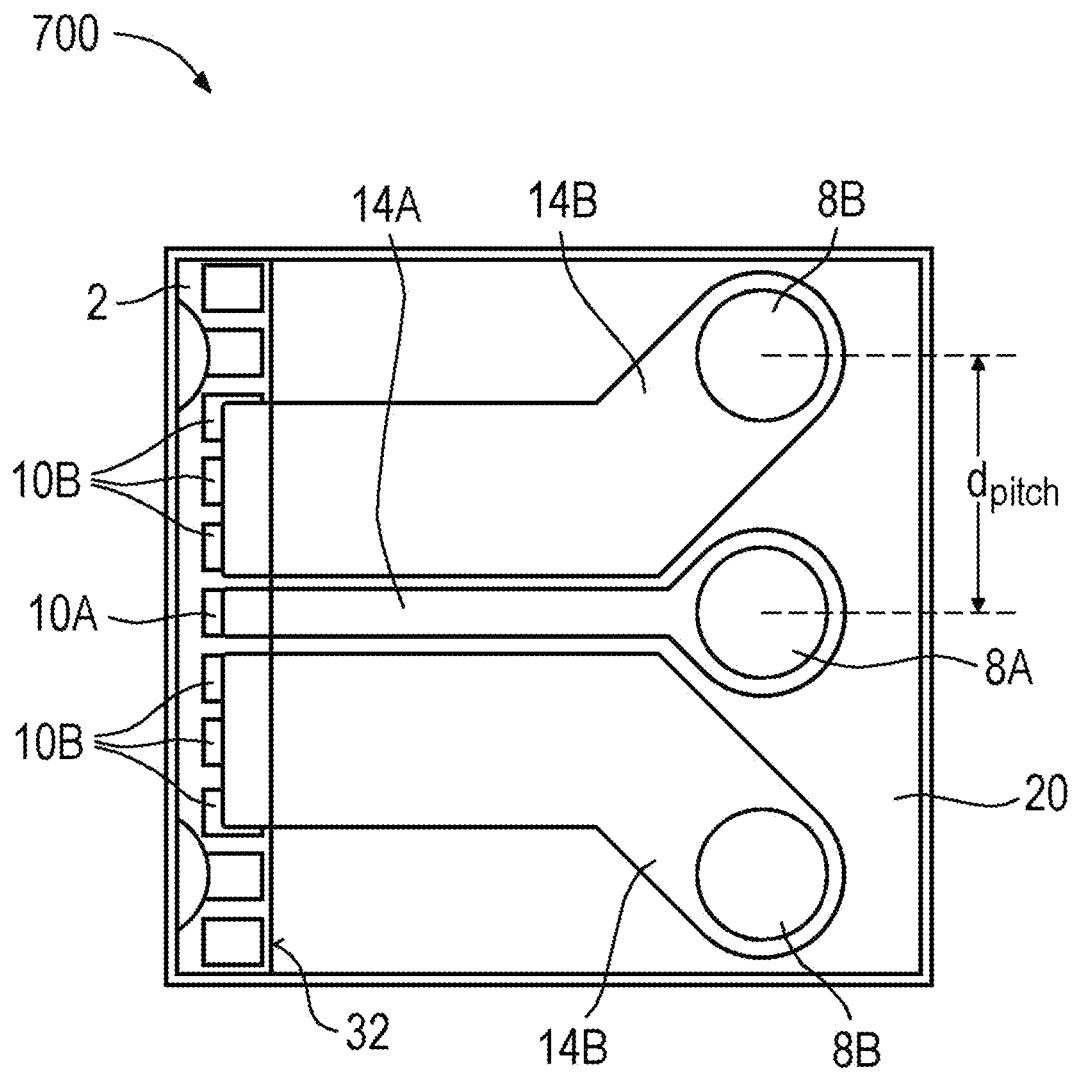
FIG. 7 schematically illustrates a top view of a portion of a semiconductor device 700 in accordance with the disclosure.

The semiconductor device 700 of FIG. 7 may include some or all of the features of the semiconductor devices described in connection with foregoing examples. Starting at an edge 32 of the semiconductor chip 2 and following the x-direction, the ground lines 14B and the signal line 14A may at least partly extend in a parallel direction. Further following the x-direction, the distance between the ground lines 14B and the signal line 14A may increase. In the example of FIG. 7, the distance between the right end point of the signal line 14A and the edge 32 of the semiconductor chip 2 may substantially equal the distance between the right end point of the ground line 14B and the edge 32 of the semiconductor chip 2. Signal lines of semiconductor devices in accordance with the disclosure as described herein may, for example, have a length of more than about 250 micrometers, or more than about 260 micrometers, or more than about 270 micrometers, or more than about 280 micrometers, or more than about 290 micrometers. In this regard, the length may measure from the electrical contact 10A of the semiconductor chip 2 (e.g., from the center of the electrical contact 10A) to the external connection element 8A (e.g., to the center of the external connection element 8A).

Compared to previously discussed examples, the external connection element 8A as shown in FIG. 7 is shifted to the right. That is, a distance between the external connection element 8A and the edge 32 of the semiconductor chip 2 may be increased. Such increased distance may result in an even more increased reduction of an electromagnetic coupling between the external connection element 8A and the substrate of the semiconductor chip 2, for example, when such a distance is greater than a thickness of the silicon substrate (or the semiconductor chip 2) and/or a diameter of the connection element 8A.

For example, the semiconductor device 700 of FIG. 7 may correspond to an eWLB device in which the external connection elements 8A and 8B may be arranged based on a ball grid array. The ball grid array may correspond to a regular rectangular grid having a ball pitch of $d_{pitch}$ measured between adjacent balls. In the example of FIG. 7, the signal line 14A may have a length in the x-direction of at least twice the ball pitch $d_{pitch}$. Compared to this, the length of the signal line 14A in previously discussed examples (see e.g., FIG. 5) may only have a length in the x-direction of once the ball pitch $d_{pitch}$.

Figure 8:
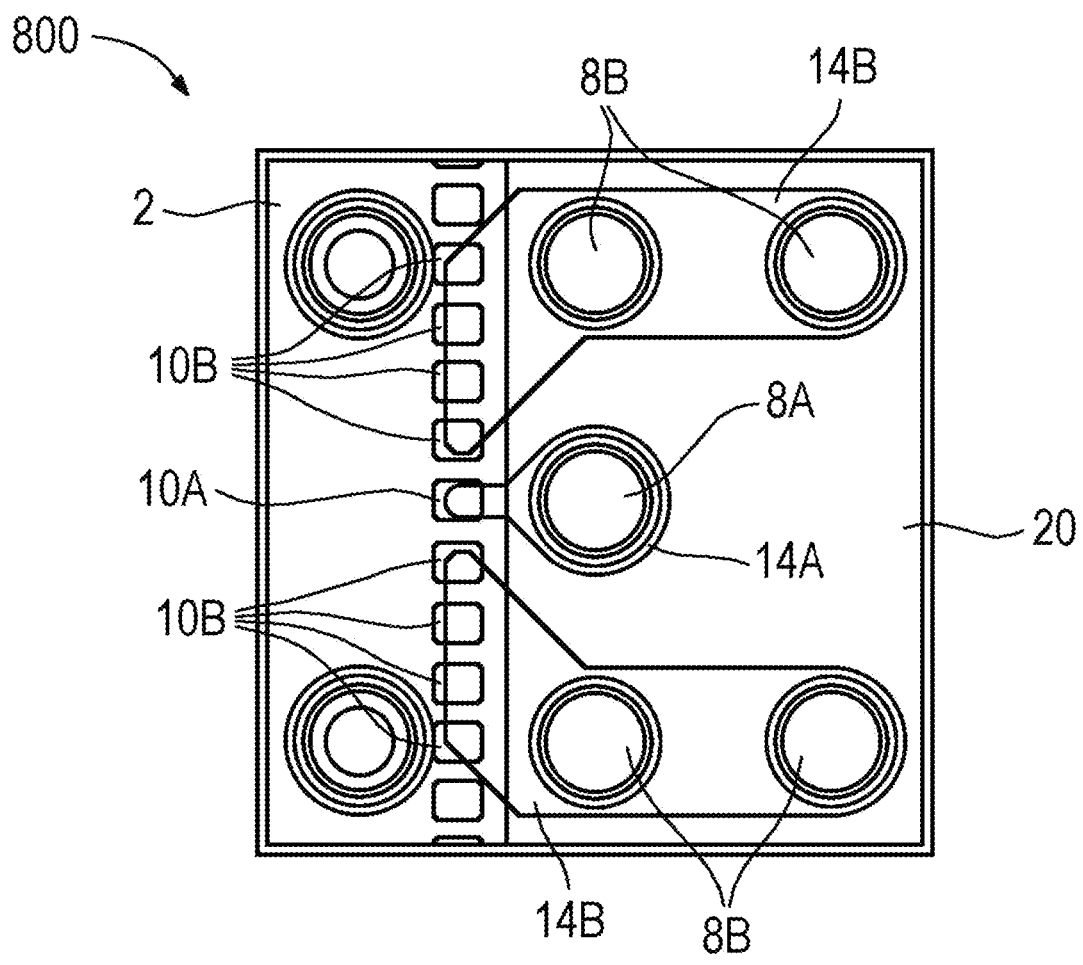
FIG. 8 schematically illustrates a top view of a portion of a semiconductor device 800.

The semiconductor device 800 of FIG. 8 may include some or all of the features of the semiconductor device 400 of FIG. 4. In contrast to FIG. 4, the ground lines 14B of the semiconductor device 800 shown in FIG. 8 are shorter and may be connected to the printed circuit board 20 via only two external connection elements 8B.

Figure 9:
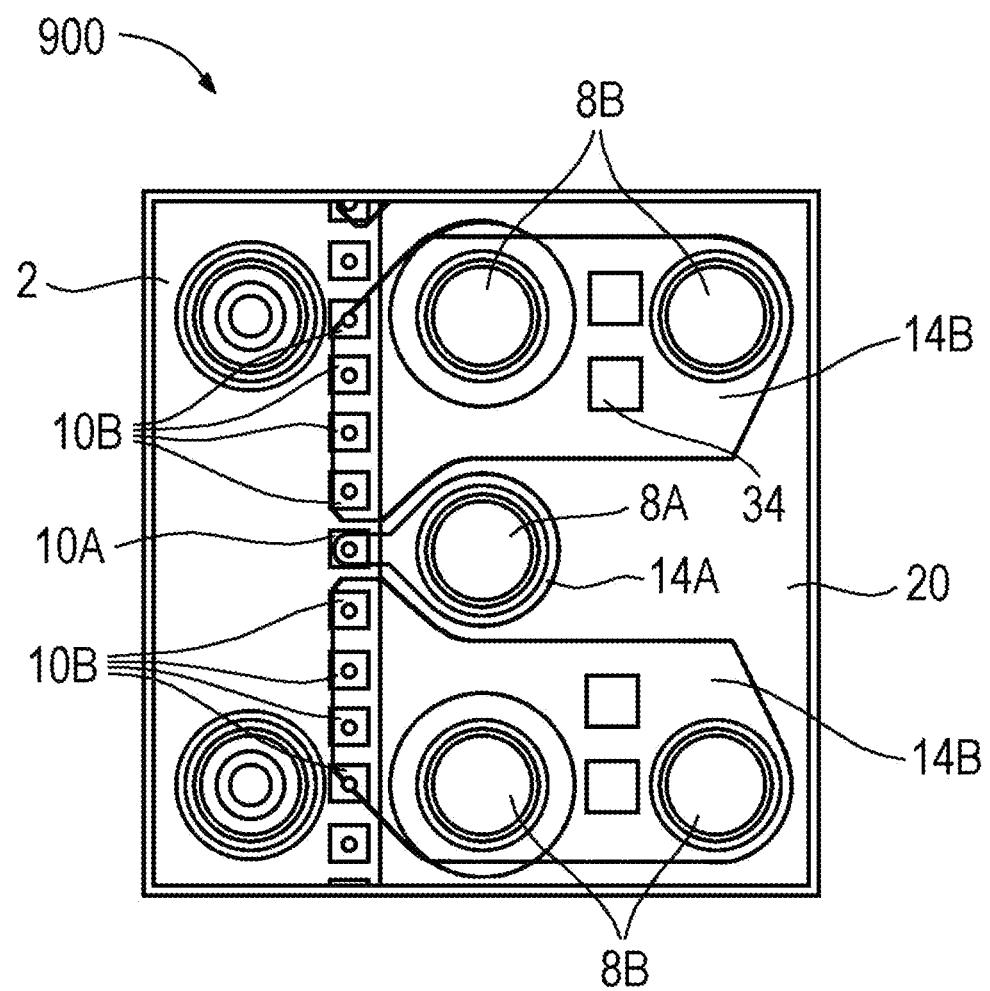
FIG. 9 schematically illustrates a top view of a portion of a semiconductor device 900 in accordance with the disclosure.

The semiconductor device 900 of FIG. 9 may include some or all of the features of the semiconductor device 500 of FIG. 5. In contrast to FIG. 5, the ground lines 14B of the semiconductor device 900 according to FIG. 9 are shorter and may be connected to the printed circuit board 20 via only two external connection elements 8B.

The semiconductor device 1000 of FIG. 10 may include some or all of the features of the semiconductor device 900 of FIG. 9. In particular, FIG. 10 illustrates the shape of the signal line 14A and the ground lines 14B arranged in the electrical redistribution layer in more detail. The external connection elements arranged underneath the electrically conductive structures 14A and 14B are not shown for the sake of simplicity. Each of the ground lines 14B may include a cheesing pattern with multiple holes.

Figure 11:
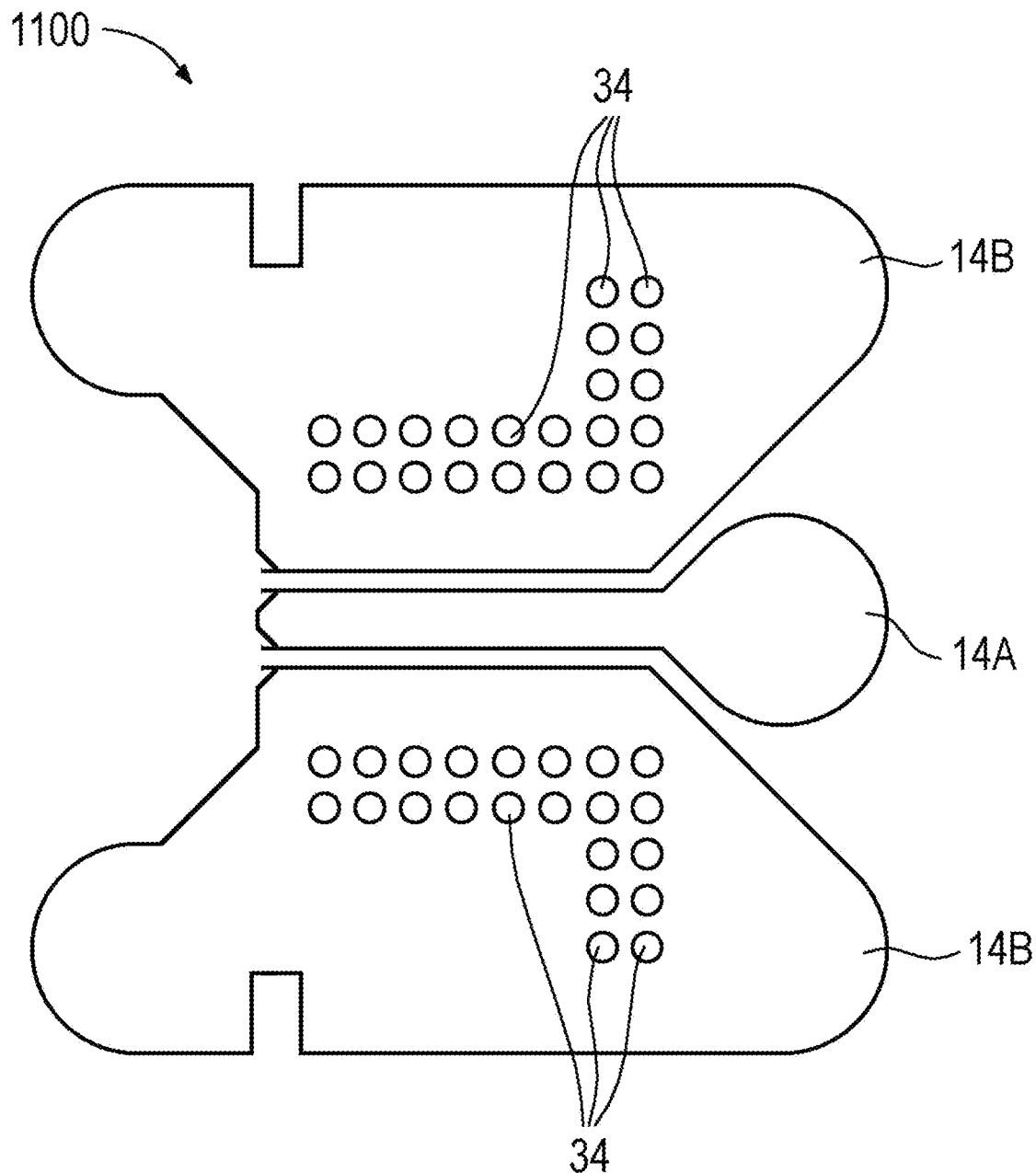
FIG. 11 schematically illustrates a top view of a portion of a semiconductor device 1100 in accordance with the disclosure.

The semiconductor device 1100 of FIG. 11 may include some or all of the features of the semiconductor devices described in connection with foregoing examples. FIG. 11 illustrates a further possible shape of a signal line 14A and ground lines 14B arranged in an electrical redistribution layer of a semiconductor device in accordance with the disclosure. The illustrated shape of the electrically conductive structures 14A and 14B may be at least partly similar to FIG. 7. In addition, each of the ground lines 14B may include a cheesing pattern with multiple holes 34. It is to be noted that cheesing patterns as described herein are optional and may, for example, be added due to process reasons (e.g., layer adhesion) and/or reliability reasons (e.g. to reduce thermomechanical stress).

Figure 12:
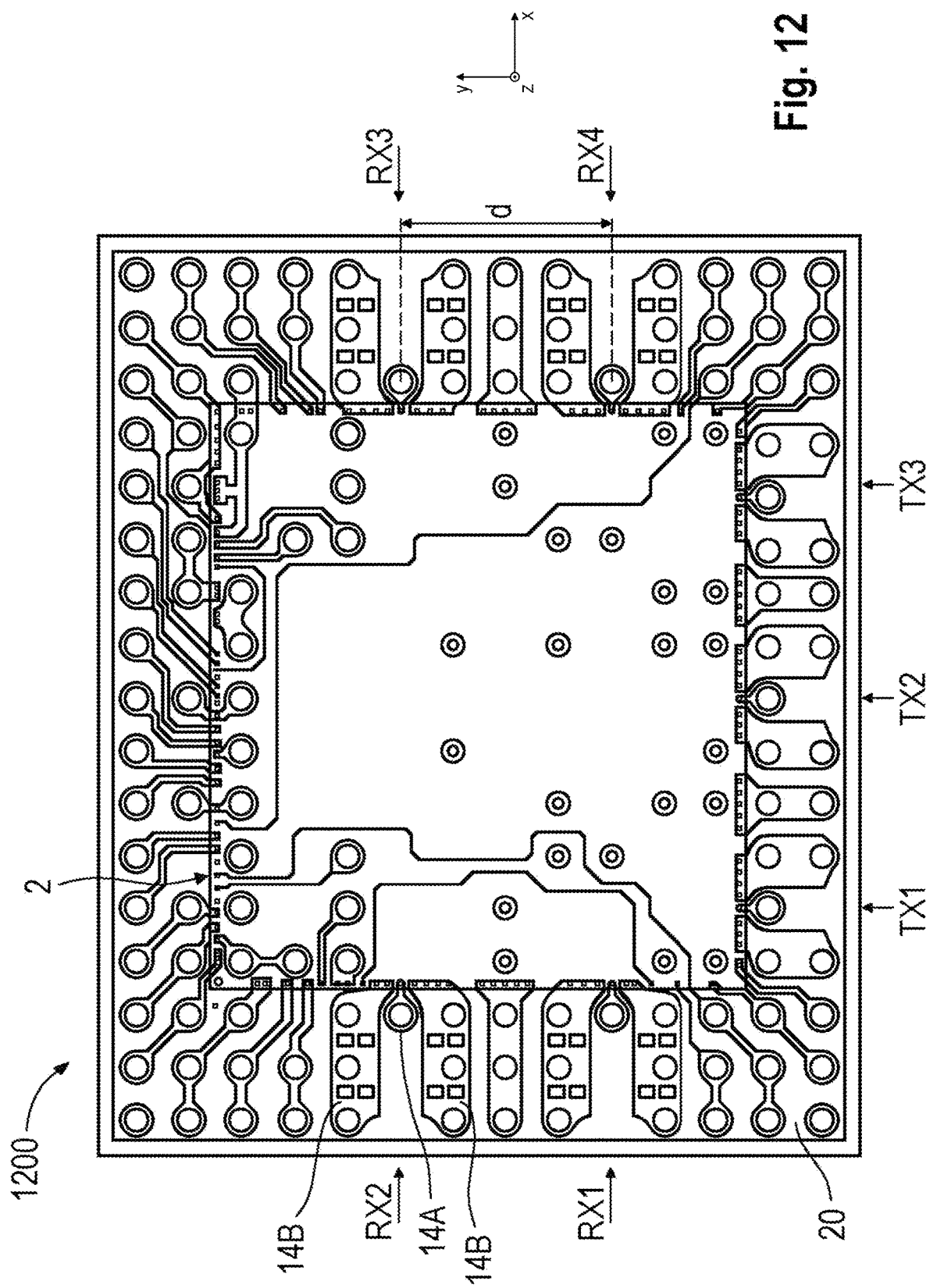
FIG. 12 schematically illustrates a top view of a semiconductor device 1200 in accordance with the disclosure.

The semiconductor device 1200 of FIG. 12 may include some or all of the features of the semiconductor devices described in connection with foregoing examples. In some implementations, the semiconductor device 1200 may be similar to the semiconductor device 200 of FIG. 2. The semiconductor device 1200 may include three transmit (TX) channels TX1 to TX3 that may be arranged at a lower edge of the semiconductor device 1200. In addition, the semiconductor device 1200 may include two receive (RX) channels RX1 and RX2 that may be arranged at a left edge of the semiconductor device 1200 as well as two receive (RX) channels RX3 and RX4 arranged at a right edge of the semiconductor device 1200. It is understood that other semiconductor devices in accordance with the disclosure may include an arbitrary different numbers of TX channels and/or RX channels arranged at arbitrary chip edges.

Each of the channels may be associated with a signal line and a corresponding GSG arrangement as described in connection with foregoing examples. In particular, the GSG arrangements of the RX channels may be similar to FIG. 5 while the GSG arrangements of the TX channels may be similar to FIG. 9. An electromagnetic isolation between a first one of the signal lines and a second one of the signal lines arranged adjacent to the first signal line (e.g., between channel RX3 and channel RX4, or between channel TX3 and channel RX3) may be more than about 30 dB or more than about 25 dB. In some implementations, the electromagnetic isolation may have a value in a range from about 30 dB to about 35 dB. Compared to conventional semiconductor devices including GSG arrangements similar to FIGS. 4 and 8, an electromagnetic isolation in a semiconductor device in accordance with the disclosure may be increased by a value lying in a range from about 5 dB to about 10 dB. It is understood that an electromagnetic isolation between two channels may depend on a distance between the signal lines of the channels. In the example of FIG. 12, a distance d between adjacent channels (or between adjacent signal lines) (e.g., between RX3 and RX4, or between RX3 and TX3) may be smaller than about 3.5 mm, smaller than about 3.0 mm, smaller than about 2.0 mm, or smaller than about 1.5 mm.

Figure 13:
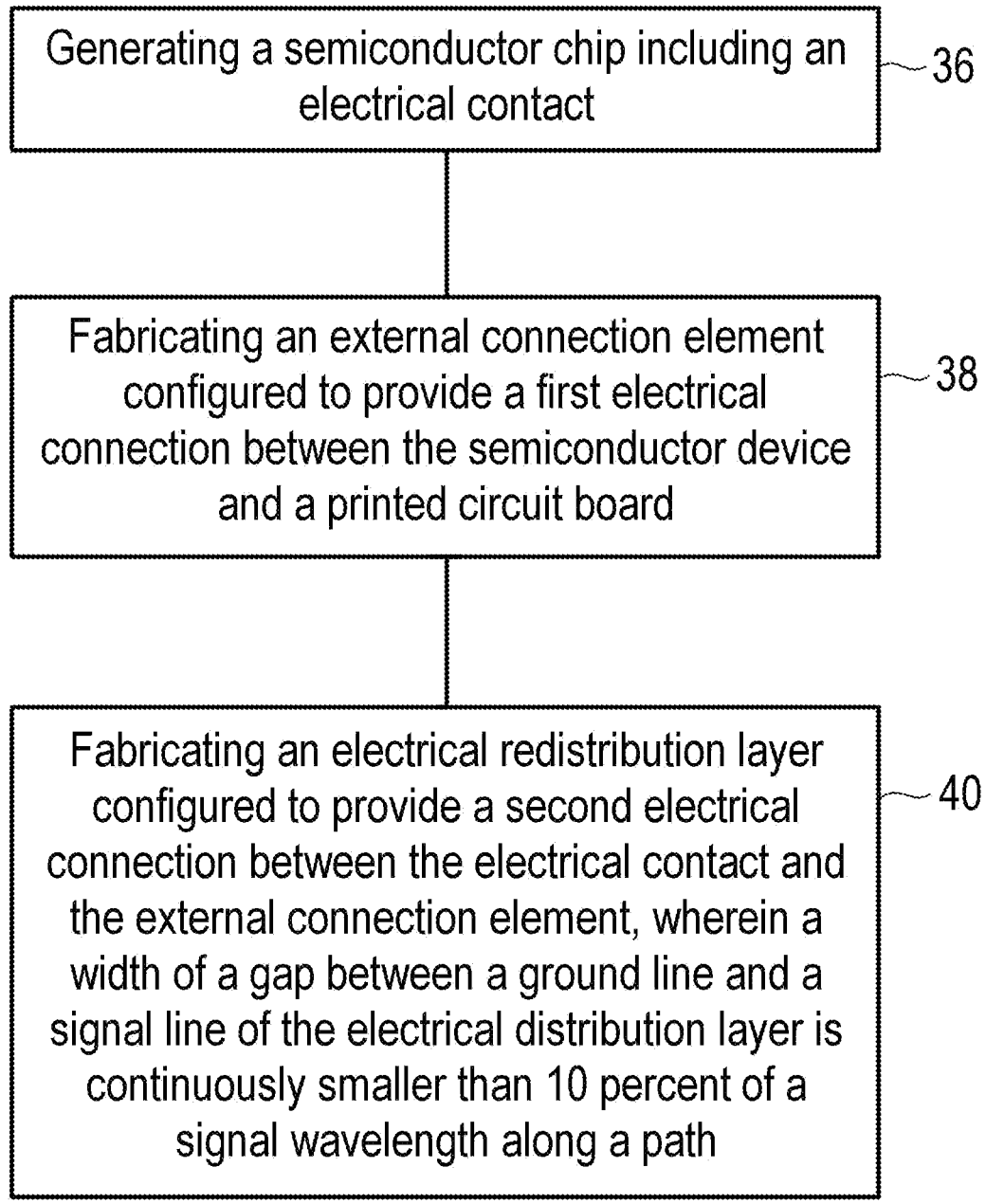
FIG. 13 illustrates a flowchart of a method for manufacturing a semiconductor device in accordance with the disclosure.

FIG. 13 illustrates a flowchart of a method for manufacturing a semiconductor device in accordance with the disclosure. The method of FIG. 13 is described in a general manner in order to qualitatively specify aspects of the disclosure. It is understood that the method of FIG. 13 may include further aspects. For example, the method of FIG. 13 may be extended by any of the aspects described in connection with other examples in accordance with the disclosure. The method of FIG. 13 may be used for manufacturing a semiconductor device in accordance with the disclosure. Accordingly, the method of FIG. 13 may be read in connection with semiconductor devices in accordance with the disclosure as previously described.

At 36, a semiconductor chip including an electrical contact arranged on a main surface of the semiconductor chip may be generated. At 38, an external connection element configured to provide a first electrical connection between the semiconductor device and a printed circuit board may be fabricated. At 40, an electrical redistribution layer extending in a direction parallel to the main surface of the semiconductor chip and configured to provide a second electrical connection between the electrical contact of the semiconductor chip and the external connection element may be fabricated.

The electrical redistribution layer may include a ground line connected to a ground potential and a signal line configured to carry an electrical signal having a wavelength. When viewed in a direction perpendicular to the main surface of the semiconductor chip: a width of a gap between the ground line and the signal line may be continuously smaller than 10 percent of the wavelength and at least smaller than 40 micrometers along a path, a starting point of the path and the electrical contact of the semiconductor chip may have a similar position with respect to a direction from the electrical contact to a center of the external connection element, and an end point of the path and the center of the external connection element may have a similar position with respect to the direction from the electrical contact to the center of the external connection element.

Figure 14:
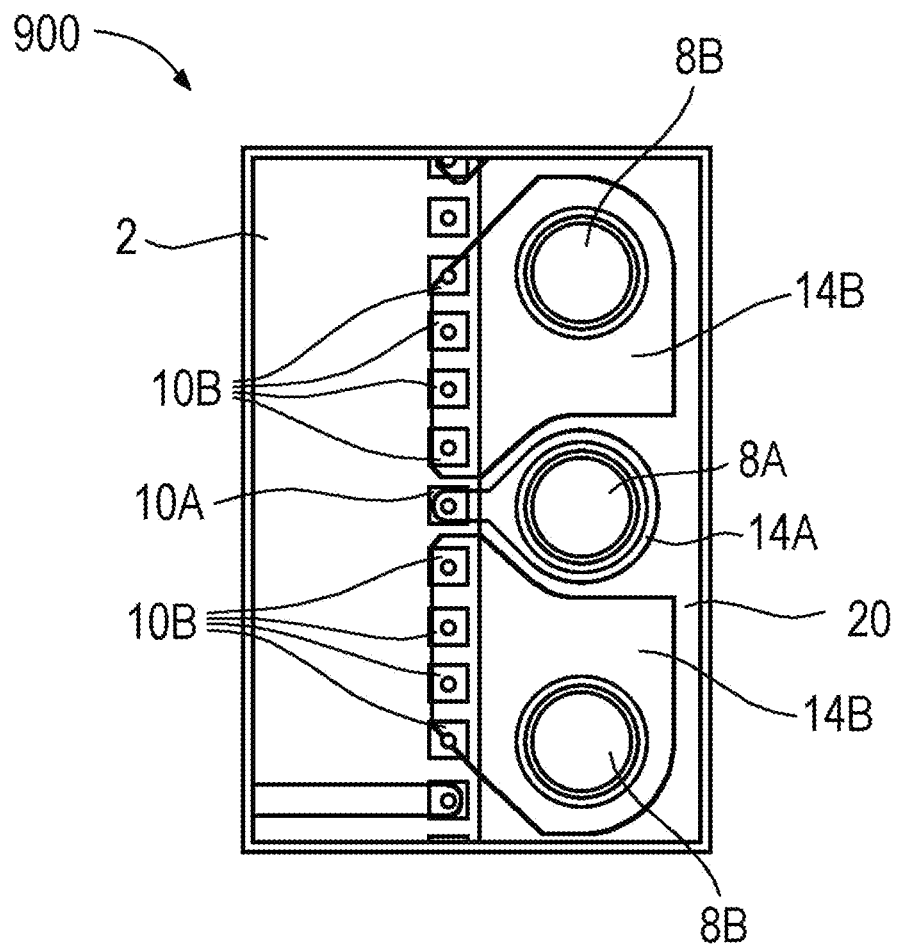
FIG. 14 schematically illustrates a top view of a portion of a semiconductor device 1400 in accordance with the disclosure.

The semiconductor device 1400 of FIG. 14 may include some or all of the features of the semiconductor device 500 of FIG. 5. In contrast to FIG. 5, the ground lines 14B of the semiconductor device 1400 according to FIG. 14 are shorter and may be connected to the printed circuit board 20 via only one external connection element 8B.

Aspects

In the following, semiconductor devices and methods for manufacturing semiconductor devices will be explained using aspects.

Aspect 1 is a semiconductor device, comprising: a semiconductor chip comprising an electrical contact arranged on a main surface of the semiconductor chip; an external connection element configured to provide a first electrical connection between the semiconductor device and a printed circuit board; and an electrical redistribution layer extending in a direction parallel to the main surface of the semiconductor chip and configured to provide a second electrical connection between the electrical contact of the semiconductor chip and the external connection element, wherein the electrical redistribution layer comprises a ground line connected to a ground potential and a signal line configured to carry an electrical signal having a wavelength, wherein, when viewed in a direction perpendicular to the main surface of the semiconductor chip: a width of a gap between the ground line and the signal line is continuously smaller than 10 percent of the wavelength and at least smaller than 40 micrometers along a path, a starting point of the path and the electrical contact of the semiconductor chip have a similar position with respect to a direction from the electrical contact to a center of the external connection element, and an end point of the path and the center of the external connection element have a similar position with respect to the direction from the electrical contact to the center of the external connection element.

Aspect 2 is a semiconductor device according to Aspect 1, wherein the width of the gap between the ground line and the signal line is continuously smaller than 5 percent of the wavelength along the path.

Aspect 3 is a semiconductor device according to Aspect 1 or 2, wherein the starting point of the path and a center of the electrical contact of the semiconductor chip have a similar position with respect to the direction from the electrical contact to the center of the external connection element.

Aspect 4 is a semiconductor device according to one of the preceding Aspects, wherein a variation of the width of the gap is continuously smaller than 25 percent of the width of the gap along the path.

Aspect 5 is a semiconductor device according to one of the preceding Aspects, wherein the width of the gap is continuously smaller than 40 micrometers along the gap.

Aspect 6 is a semiconductor device according to one of the preceding Aspects, wherein the ground line and the signal line form a coplanar waveguide.

Aspect 7 is a semiconductor device according to one of the preceding Aspects, further comprising: an encapsulation material, wherein the semiconductor chip is at least partly embedded in the encapsulation material, wherein the main surface of the semiconductor chip and a main surface of the encapsulation material are arranged in a common plane, wherein the electrical redistribution layer is at least partly extending over the main surface of the encapsulation material, and wherein the external connection element is arranged lateral to the semiconductor chip.

Aspect 8 is a semiconductor device according to one of the preceding Aspects, wherein the semiconductor device comprises an embedded wafer level ball grid array package.

Aspect 9 is a semiconductor device according to one of the preceding Aspects, wherein the external connection element is arranged based on a ball grid array having a ball pitch, wherein the signal line has a length of at least twice the ball pitch.

Aspect 10 is a semiconductor device according to one of the preceding Aspects, wherein a distance between an end point of the signal line and an edge of the semiconductor chip equals a distance between an end point of the ground line and the edge of the semiconductor chip.

Aspect 11 is a semiconductor device according to one of the preceding Aspects, wherein a distance between an end point of the signal line and an edge of the semiconductor chip is greater than a thickness of the semiconductor chip and/or a diameter of the external connection element.

Aspect 12 is a semiconductor device according to one of the preceding Aspects, wherein the ground line and the signal line at least partly extend in a parallel direction.

Aspect 13 is a semiconductor device according to one of the preceding Aspects, wherein a distance between the ground line and the signal line increases in a direction pointing away from an edge of the semiconductor chip.

Aspect 14 is a semiconductor device according to one of the preceding Aspects, wherein the electrical redistribution layer comprises a cheesing pattern.

Aspect 15 is a semiconductor device according to one of the preceding Aspects, further comprising: a further ground line connected to a ground potential, wherein the signal line is arranged between the two ground lines.

Aspect 16 is a semiconductor device according to one of the preceding Aspects, wherein the external connection element is configured to provide a mechanical connection between the semiconductor device and the printed circuit board.

Aspect 17 is a semiconductor device comprising: a semiconductor chip comprising an electrical contact arranged on a main surface of the semiconductor chip; an external connection element configured to provide a first electrical connection between the semiconductor device and a printed circuit board; and an electrical redistribution layer extending in a direction parallel to the main surface of the semiconductor chip and configured to provide a second electrical connection between the electrical contact of the semiconductor chip and the external connection element, wherein the electrical redistribution layer comprises a ground line connected to a ground potential and a signal line configured to carry an electrical signal, wherein, when viewed in a direction perpendicular to the main surface of the semiconductor chip: a variation of a width of a gap between the ground line and the signal line is continuously smaller than 25 percent of the width of the gap along a path, a starting point of the path and the electrical contact of the semiconductor chip have a similar position with respect to a direction from the electrical contact to a center of the external connection element, and an end point of the path and the center of the external connection element have a similar position with respect to the direction from the electrical contact to the center of the external connection element.

Aspect 18 is a semiconductor device according to Aspect 17, wherein the starting point of the path and the center of the electrical contact of the semiconductor chip have a similar position with respect to the direction from the electrical contact to the center of the external connection element.

Aspect 19 is a semiconductor device, comprising: a semiconductor chip comprising an electrical contact arranged on a main surface of the semiconductor chip; an external connection element configured to provide a first electrical connection between the semiconductor device and a printed circuit board; and an electrical redistribution layer extending in a direction parallel to the main surface of the semiconductor chip and configured to provide a second electrical connection between the electrical contact of the semiconductor chip and the external connection element, wherein the electrical redistribution layer comprises a ground line connected to a ground potential and a first signal line associated with a first RF channel and configured to carry an electrical signal, wherein an electromagnetic isolation between the first signal line and a second signal line arranged adjacent to the first signal line and associated with a second RF channel is more than 30 dB.

Aspect 20 is a semiconductor device according to Aspect 19, wherein a distance between the first signal line and the second signal line is smaller than 3.5 mm.

Aspect 21 is a method for manufacturing a semiconductor device, wherein the method comprises: generating a semiconductor chip comprising an electrical contact arranged on a main surface of the semiconductor chip; fabricating an external connection element configured to provide a first electrical connection between the semiconductor device and a printed circuit board; and fabricating an electrical redistribution layer extending in a direction parallel to the main surface of the semiconductor chip and configured to provide a second electrical connection between the electrical contact of the semiconductor chip and the external connection element, wherein the electrical redistribution layer comprises a ground line connected to a ground potential and a signal line configured to carry an electrical signal having a wavelength, wherein, when viewed in a direction perpendicular to the main surface of the semiconductor chip: a width of a gap between the ground line and the signal line is continuously smaller than 10 percent of the wavelength and at least smaller than 40 micrometers along a path, a starting point of the path and the electrical contact of the semiconductor chip have a similar position with respect to a direction from the electrical contact to a center of the external connection element, and an end point of the path and the center of the external connection element have a similar position with respect to the direction from the electrical contact to the center of the external connection element.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g., a material layer formed or located "over" a surface of an object may be used herein to mean that the material layer may be located (e.g. formed, deposited, etc.) "directly on", e.g. in direct contact with, the implied surface. The word "over" used with regard to e.g., a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:

1. A semiconductor device, comprising:
a semiconductor chip comprising an electrical contact arranged on a main surface of the semiconductor chip;
an external connection element configured to provide a first electrical connection between the semiconductor device and a printed circuit board; and
an electrical redistribution layer extending in a direction parallel to the main surface of the semiconductor chip and configured to provide a second electrical connection between the electrical contact of the semiconductor chip and the external connection element,
wherein the electrical redistribution layer comprises a ground line connected to a ground potential and a signal line configured to carry an electrical signal having a wavelength,
wherein, when viewed in a direction perpendicular to the main surface of the semiconductor chip:
a width of a gap between the ground line and the signal line is continuously smaller than 10 percent of the wavelength and at least smaller than 40 micrometers along a path,
a variation of the width of the gap is continuously smaller than 25 percent of the width of the gap along the path,
a starting point of the path and the electrical contact of the semiconductor chip have a similar coordinate with respect to a coordinate axis in a direction from the electrical contact to a center of the external connection element, and
an end point of the path and the center of the external connection element have a similar coordinate with respect to the coordinate axis in the direction from the electrical contact to the center of the external connection element.

2. The semiconductor device of claim 1, wherein the width of the gap between the ground line and the signal line is continuously smaller than 5 percent of the wavelength along the path.

3. The semiconductor device of claim 1, wherein the starting point of the path and a center of the electrical contact of the semiconductor chip have a similar coordinate with respect to the coordinate axis in the direction from the electrical contact to the center of the external connection element.

4. The semiconductor device of claim 1, wherein the width of the gap is continuously smaller than 40 micrometers along the path.

5. The semiconductor device of claim 1, wherein the ground line and the signal line form a coplanar waveguide.

6. The semiconductor device of claim 1, further comprising:
an encapsulation material, wherein the semiconductor chip is at least partly embedded in the encapsulation material, wherein the main surface of the semiconductor chip and a main surface of the encapsulation material are arranged in a common plane, wherein the electrical redistribution layer is at least partly extending over the main surface of the encapsulation material, and wherein the external connection element is arranged lateral to the semiconductor chip.

7. The semiconductor device of claim 1, wherein the semiconductor device comprises an embedded wafer level ball grid array package.

8. The semiconductor device of claim 1, wherein the external connection element is arranged based on a ball grid array having a ball pitch, wherein the signal line has a length of at least twice the ball pitch.

9. The semiconductor device of claim 1, wherein a distance between an end point of the signal line and an edge of the semiconductor chip equals a distance between an end point of the ground line and the edge of the semiconductor chip.

10. The semiconductor device of claim 1, wherein a distance between an end point of the signal line and an edge of the semiconductor chip is greater than one or more of a thickness of the semiconductor chip or a diameter of the external connection element.

11. The semiconductor device of claim 1, wherein the ground line and the signal line at least partly extend in a parallel direction.

12. The semiconductor device of claim 1, wherein a distance between the ground line and the signal line increases in a direction pointing away from an edge of the semiconductor chip.

13. The semiconductor device of claim 1, wherein the electrical redistribution layer comprises a cheesing pattern.

14. The semiconductor device of claim 1, further comprising:
a further ground line connected to a ground potential, wherein the signal line is arranged between the ground line and the further ground line.

15. The semiconductor device of claim 1, wherein the external connection element is configured to provide a mechanical connection between the semiconductor device and the printed circuit board.

16. A semiconductor device, comprising:
a semiconductor chip comprising an electrical contact arranged on a main surface of the semiconductor chip;
an external connection element configured to provide a first electrical connection between the semiconductor device and a printed circuit board; and
an electrical redistribution layer extending in a direction parallel to the main surface of the semiconductor chip and configured to provide a second electrical connection between the electrical contact of the semiconductor chip and the external connection element,
wherein the electrical redistribution layer comprises a ground line connected to a ground potential and a signal line configured to carry an electrical signal,
wherein, when viewed in a direction perpendicular to the main surface of the semiconductor chip:
a variation of a width of a gap between the ground line and the signal line is continuously smaller than 25 percent of the width of the gap along a path,
a starting point of the path and the electrical contact of the semiconductor chip have a similar coordinate with respect to a coordinate axis in a direction from the electrical contact to a center of the external connection element, and
an end point of the path and the center of the external connection element have a similar coordinate with respect to the coordinate axis in the direction from the electrical contact to the center of the external connection element.

17. The semiconductor device of claim 16, wherein the starting point of the path and the center of the electrical contact of the semiconductor chip have a similar coordinate with respect to the coordinate axis in the direction from the electrical contact to the center of the external connection element.

18. The semiconductor device of claim 16, wherein:
the signal line is associated with a first RF channel, and
an electromagnetic isolation between the signal line and a further signal line, arranged adjacent to the signal line and associated with a second RF channel, is more than 30 dB.

19. The semiconductor device of claim 18, wherein a distance between the signal line and the further signal line is smaller than 3.5 mm.

20. A method for manufacturing a semiconductor device, wherein the method comprises:
generating a semiconductor chip comprising an electrical contact arranged on a main surface of the semiconductor chip;
fabricating an external connection element configured to provide a first electrical connection between the semiconductor device and a printed circuit board; and
fabricating an electrical redistribution layer extending in a direction parallel to the main surface of the semiconductor chip and configured to provide a second electrical connection between the electrical contact of the semiconductor chip and the external connection element,
wherein the electrical redistribution layer comprises a ground line connected to a ground potential and a signal line configured to carry an electrical signal having a wavelength,
wherein, when viewed in a direction perpendicular to the main surface of the semiconductor chip:
a width of a gap between the ground line and the signal line is continuously smaller than 10 percent of the wavelength and at least smaller than 40 micrometers along a path,
a variation of the width of the gap is continuously smaller than 25 percent of the width of the gap along the path,
a starting point of the path and the electrical contact of the semiconductor chip have a similar coordinate with respect to a coordinate axis in a direction from the electrical contact to a center of the external connection element, and
an end point of the path and the center of the external connection element have a similar coordinate with respect to the coordinate axis in the direction from the electrical contact to the center of the external connection element.

21. A semiconductor device, comprising:
a semiconductor chip comprising an electrical contact arranged on a main surface of the semiconductor chip;
an external connection element configured to provide a first electrical connection between the semiconductor device and a printed circuit board; and
an electrical redistribution layer extending in a direction parallel to the main surface of the semiconductor chip and configured to provide a second electrical connection between the electrical contact of the semiconductor chip and the external connection element,
wherein the electrical redistribution layer comprises a ground line connected to a ground potential and a signal line configured to carry an electrical signal having a wavelength,
wherein the electrical redistribution layer comprises a cheesing pattern,
wherein, when viewed in a direction perpendicular to the main surface of the semiconductor chip:
a width of a gap between the ground line and the signal line is continuously smaller than 10 percent of the wavelength and at least smaller than 40 micrometers along a path,
a starting point of the path and the electrical contact of the semiconductor chip have a similar coordinate with respect to a coordinate axis in a direction from the electrical contact to a center of the external connection element, and
an end point of the path and the center of the external connection element have a similar coordinate with respect to the coordinate axis in the direction from the electrical contact to the center of the external connection element.

* * * * *